United States Patent [19]

Shedd et al.

[11] 4,323,851
[45] Apr. 6, 1982

[54] WIDE RANGE MULTIPLE TIME MARK GENERATOR

[75] Inventors: Walter M. Shedd, Acton; Donald C. LaPierre, West Acton, both of Mass.

[73] Assignee: The United States of America as represented by the Secretary of the Air Force, Washington, D.C.

[21] Appl. No.: 128,345

[22] Filed: Mar. 7, 1980

[51] Int. Cl.³ ............................................. H03K 17/00
[52] U.S. Cl. ...................................... 328/72; 328/48; 328/129
[58] Field of Search ...................... 328/129, 48, 62, 72

[56] References Cited
U.S. PATENT DOCUMENTS 3,383,525  5/1968  Arksey .................................. 307/269
3,564,426  2/1971  Anderson et al. ..................... 328/48

Primary Examiner—David K. Moore
Attorney, Agent, or Firm—Donald J. Singer; Henry S. Miller

[57] ABSTRACT

A time pulse generator producing selectively, singular or multiple output pulses over a range from 1 sec to 10 seconds with provision for preselected reset. Additional features include an output for all pulses, an output increasing as the sum of the number of output pulses increase, and a blanking output pulse adapted to control the duration of a cathode raybeam in an oscilloscope application.

10 Claims, 3 Drawing Figures

WIDE RANGE MULTIPLE TIME MARK GENERATOR

STATEMENT OF GOVERNMENT INTEREST

The invention described herein may be manufactured and used by or for the Government for governmental purposes without the payment of any royalty thereon.

BACKGROUND OF THE INVENTION

This invention relates generally to time pulse generators and more particularly to a single such generator capable of multiple independent outputs over a wide range of delay times.

The electronics art is replete with various and sundry time mark generators. Such devices are available in large boxes and small boxes, in long time duration and short time duration, in multiple inputs and singular inputs. However there is no time mark generator available that is capable of generating multiple variable time pulse outputs.

Previous to this invention when multiple time pulses were required at varying intervals, a plurality of generators were required. In essence one generator was needed for each of the varying pulses. The main problem then became to arrange the pulse requirement so that the maximum amount of pulses could be derived from the minimum number of generators.

It seems obvious then that when a number of pulses were required at various times, the number of generators became excessive and expensive.

One definitive sample of such a situation is in the study of certain radiation decay rates where multiple detectors would be opened and closed at various times to allow for an accurate profile of the radiation decay.

SUMMARY OF THE INVENTION

The invention consists of an electronic timing circuit triggered by an event which is characterized by an input pulse. A latch circuit actuates an oscillator which generates a series of uniform pulses. The pulses are counted in a plurality of counters which are so connected that the counting sequence may be ended and the generator reset after each counter has completed its function.

Oscillator output is fed to a series of NAND gates which generate a pulse. This pulse which by design, occurs at a preselected time after the trigger pulse. Manually operated selection switches either enable or disable the pulse for each selected time from continuing in its circuit.

A selected timing pulse is sent to a latch circuit which is activated triggering a one shot multivibrator which in turn generates a pulse which is gated as output.

The latch circuit output signal also passes through a resistor, generating a current which is connected to the other latch circuit outputs. This current biases an emitter follower and produces a signal to perform some appropriate function.

A second output from the one shot multivibrator is fed to a gate where a signal is produced to indicate all pulses from all selected counting circuits.

A second one shot multivibrator is connected to a counter selection switch which generates a master reset pulse, thereby causing the latching circuits to turn off and the entire generator to reset and await a further triggering pulse.

Connected to the line from the all output gate is a flip flop circuit which creates a blanking pulse adopted to be used in a photographic-oscilloscope situation where the cathode ray beam is switched off after the timing pulse to avoid overexposing the photographic film when the beam is on standby.

It is therefore an object of the invention to provide a new and improved wide range multiple time mark generator.

It is another object of the invention to provide a new and improved time mark generator that has multiple time delay output pulses.

It is a further object of the invention to provide a new and improved time mark generator that provides multiple output pulses over a wider range of time than any hitherto known similar devices.

It is still another object of the invention to provide a new and improved time mark generator that provides for individual selection of time pulses.

It is still a further object of the invention to provide a new and improved time mark generator that has a variable end count time selector.

It is still another object of the invention to provide a new and improved time mark generator that provides current indicative of the total number of output pulses.

It is still another object of the invention to provide a new and improved time mark generator that provides signals representing all individually selected time pulses.

It is another object of the invention to provide a time mark generator which is economical to produce and utilizes conventional, currently available components that lend themselves to standard mass production manufacturing techniques.

These and other advantages, features and objects of the invention will become more apparent from the following description taken in connection with the illustrative embodiment in the accompanying drawing.

DESCRIPTION OF THE PREFERRED EMBODIMENT

Figure 1:
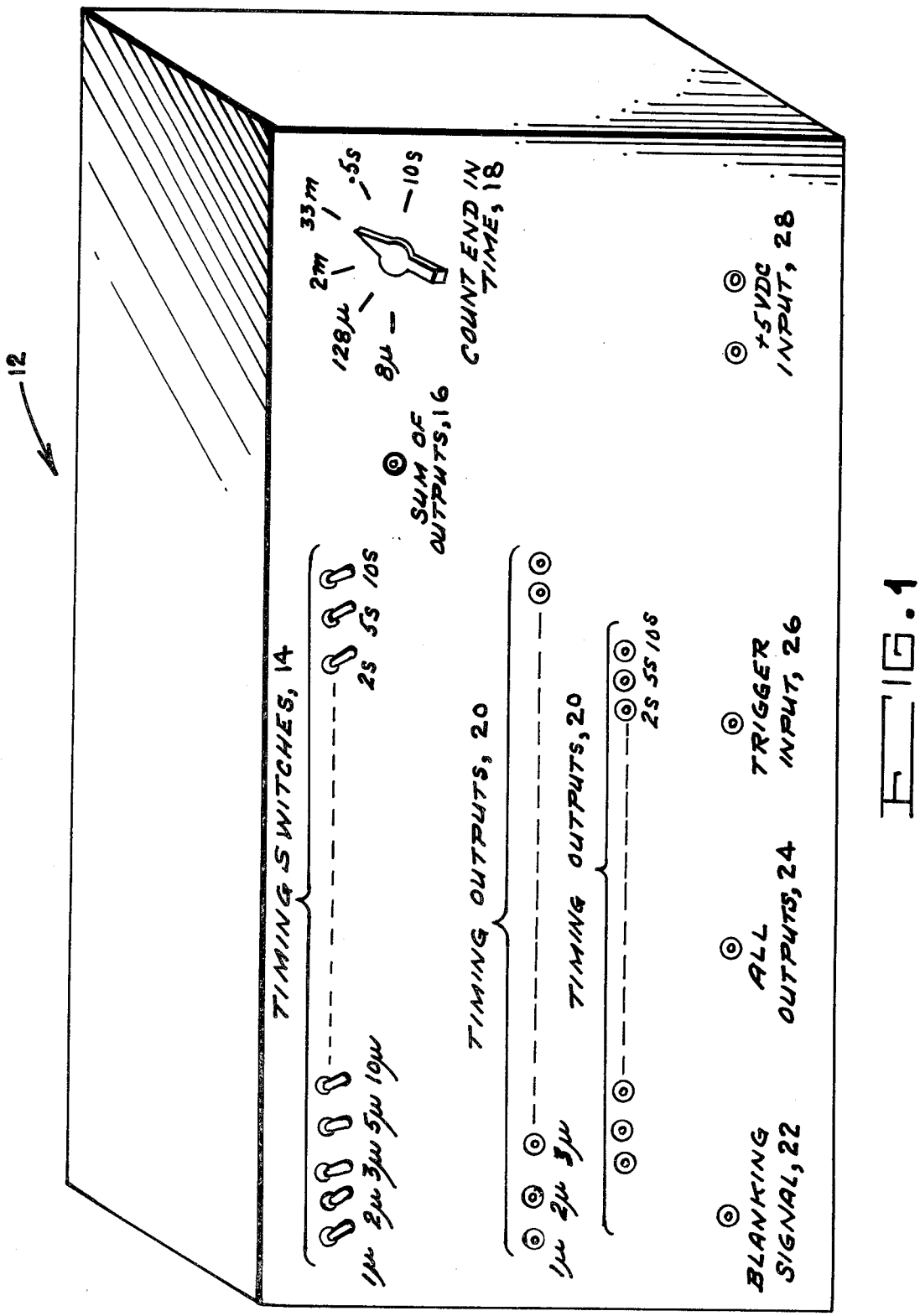
FIG. 1 is a front plan view of the invention showing the controls and connections.

Referring now to FIG. 1, a control panel is shown attached to a housing 12 containing conventional electrical components of the invention. Near the top of the panel are a plurality of toggle ON-OFF switches 14. The number of switches is variable depending upon the number of time pulses desired.

A jack 16 provides a voltage indicative of the sum of the output pulses.

In the event it is desired to recycle the timer without waiting for the full cycle (in this case 10 seconds) a selector switch 18 is provided which will cause the timer to recycle when the time indicated has been reached.

Timing pulse output jacks 20 are provided in two rows below the switches, however each jack 22 corresponds to one of the above switches. A blanking signal jack is provided for turning off a cathode ray beam in an appropriately equipped oscilloscope. All outputs jack 24 provides a pulse each time a pulse leaves any of the timing output circuits. Trigger input jack 26 accepts the pulse which initiates the timing cycle. A 5 volt DC input voltage is supplied via terminals 28 for operating the system although an internal power supply could be included in the housing.

Figure 2:
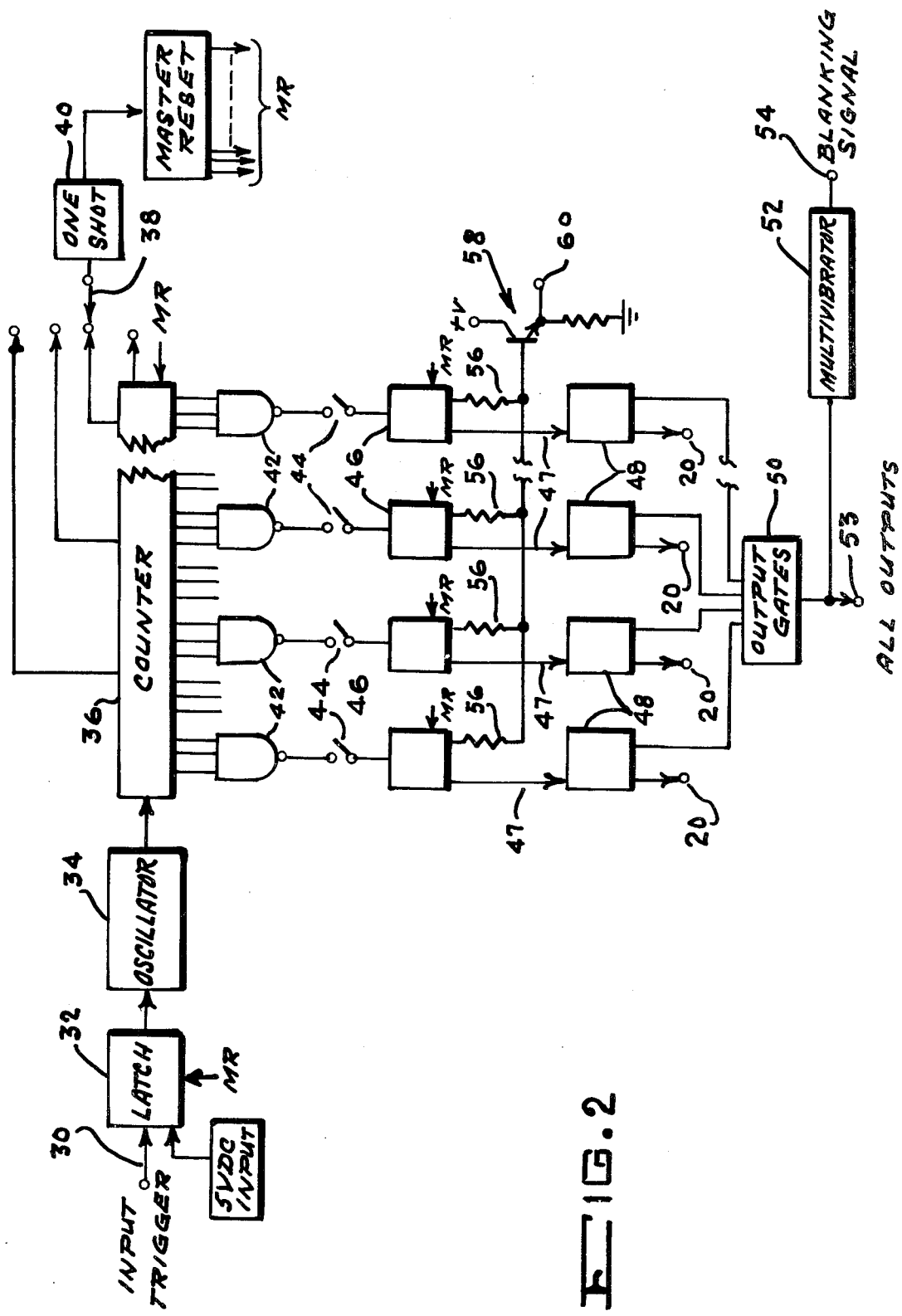
FIG. 2 is a block diagram of the invention.
Figure 3:
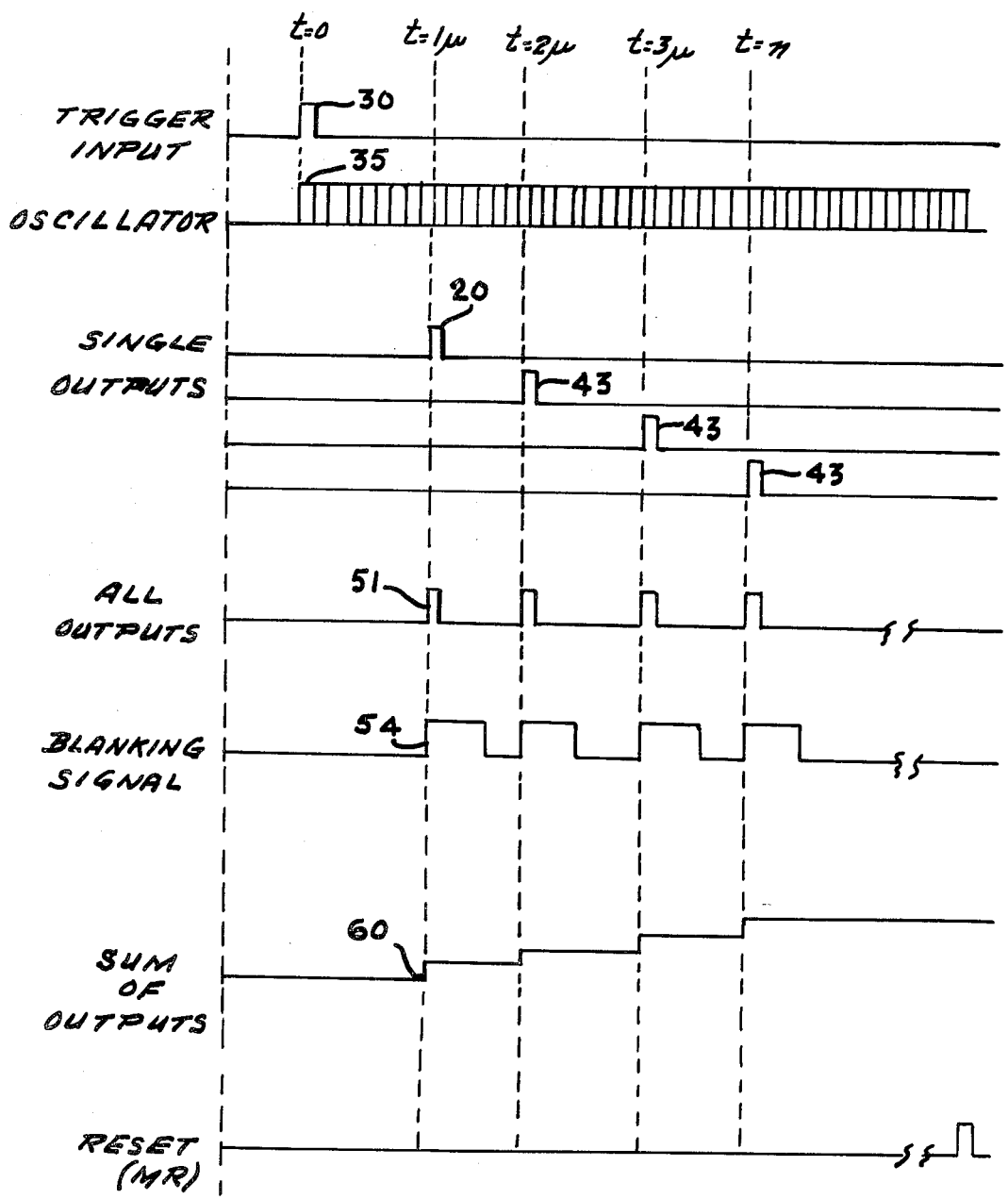
FIG. 3 is a comparative graphic representation of the pulses in the circuit of the invention.

Concerning FIGS. 2 and 3, a trigger input pulse 30 enters the circuit and activates latch circuit 32 which is held down and activates oscillator 34. A 5 volt DC source is provided for the circuit through latch circuit 32. The oscillator generates a series of pulses 35 that are sent to counter 36 where the pulses are divided by two and converted to binary output. At selected locations in the counter, most conveniently after each counter where a plurality of counters are used, a line is run to a selector switch (18) which passes the signal to a one-shot multivibrator 40. Output from the multivibrator is a master reset pulse (MR) and is sent to the various latch circuits in the invention, effectively switching the circuit off and resetting the circuit to await the next input trigger pulse.

NAND gates 42 receive counter output and produce a series of timed pulses which are sent to latch circuits 46. The gates are so arranged that the delay output signal will be logarithmic in units of 1, 2, 3 and 5. The series of single pulses are generated as shown by 43 in FIG. 3. The time delay is selected by toggle switches 44.

The output from each NAND gate is sent to latch circuit 46 where a trigger level pulse is sent to a one shot multivibrator 48 via line 47. The multivibrator generates an output pulse which is sent to the output jack 20. The output pulse is also sent to a set of output gates 50 which generate the all output signal 51.

A signal from all output line 53 is taken through one shot multivibrator 52 providing the blanking circuit signal 54.

Referring now to latch circuits 46, an output level is sent through a load resister 56 creating a selected current. The currents are cummulative from each latch circuit and bias emitter follower 58 to produce an output voltage 60 which indicates the sum of the pulses having been generated as output.

Upon completing a cycle, signal (MR) from the master reset is sent to all latch circuits effectively resetting the timer to zero and awaiting another input trigger pulse.

Although the invention has been described with reference to a particular embodiment, it will be understood to those skilled in the art that the invention is capable of a variety of alternative embodiments within the spirit and scope of the appended claims.

What is claimed is:

1. A wide range variable multiple time pulse generator comprising: a housing having a control panel including means for accepting an input pulse, a plurality of pulse output means, a plurality of switching means corresponding to the output means for selecting discrete output pulses; said housing having mounted therein an electronic circuit connected to the control panel means for providing output signals in response to an input signal, said circuit including an oscillator for generating a series of pulses at a selected frequency, a latch circuit means connected between the means for accepting an input pulse and the oscillator, said latch circuit means activating the oscillator in response to a first input pulse; counter means connected to the oscillator for counting pulses generated by the oscillator; a plurality of NAND gate circuits connected to the counter producing a selected binary output; latch circuit means connected to the output of each NAND gate circuit, pulse generating means connected between each latch circuit and the pulse output means whereby a single pulse is generated as a result of the first output pulse from each NAND gate circuit.

2. A wide range variable multiple time pulse generator according to claim 1 further including, a reset circuit having a switch for selectively determining the reset time of the latch circuit connected to the counter means, a pulse generator connected to said switch whereby a pulse is generated upon a selected count from said counter, and a master reset circuit means connected to the pulse generating means and the latch circuit means whereby said circuits are reset upon a pulse from said pulse generator.

3. A wide range variable multiple time pulse generator according to claim 2 wherein said pulse generator is a one shot multivibrator circuit.

4. A wide range variable multiple time pulse generator, according to claim 2 further including a single output means on said control panel for providing an output pulse for each selected individual pulse.

5. A wide range variable multiple time pulse generator according to claim 4 including a gate circuit connected to each output pulse generator means providing an output pulse for each selected individual pulse at said single output means.

6. A wide range variable multiple time pulse generator according to claim 5 including a multivibrator circuit connected to the output of said gate circuit whereby a blanking signal is generated with each output pulse, said circuit means further connected to an output means mounted on the control panel for providing the blanking signal output.

7. A wide range variable multiple time pulse generator according to claim 6 including circuit means connected to all latch circuits for providing a cumulative output signal indicative of the sum of the output pulses said circuit means connected to an output means mounted on the control panel for providing the sum of the output signal.

8. A wide range variable multiple time pulse generator according to claim 1 further including in said housing a power supply connected to said electronic circuit.

9. A wide range variable multiple time pulse generator according to claim 1 further including switch means connected between each NAND gate circuit and latch circuit for selecting individual pulsed output.

10. A wide range variable multiple time pulse generator according to claim 9 wherein the output pulses are separated logarithmically by time.

* * * * *